(12) United States Patent
Park et al.

(10) Patent No.: US 8,961,692 B2
(45) Date of Patent: Feb. 24, 2015

(54) EVAPORATING APPARATUS

(75) Inventors: Jae-Wan Park, Yongin (KR); You-Min Cha, Yongin (KR); Jae-Hong Ahn, Yongin (KR); Won-Seok Cho, Yongin (KR); Jae-Mork Park, Yongin (KR); Min-Jeong Hwang, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 576 days.

(21) Appl. No.: 12/659,987

(22) Filed: Mar. 26, 2010

(65) Prior Publication Data

US 2010/0275842 A1 Nov. 4, 2010

(30) Foreign Application Priority Data

Apr. 30, 2009 (KR) .................. 10-2009-0038450

(51) Int. Cl.
| C23C 16/00 | (2006.01) |
| C23C 14/24 | (2006.01) |
| C23C 14/04 | (2006.01) |

(52) U.S. Cl.
CPC ............. *C23C 14/243* (2013.01); *C23C 14/044* (2013.01)
USPC ........................................ 118/726; 118/727

(58) Field of Classification Search
USPC ................................ 118/726, 727
See application file for complete search history.

(56) References Cited

U.S. PATENT DOCUMENTS

| 3,519,481 | A | * | 7/1970 | Rairden et al. .................. 427/63 |
| 5,418,348 | A | * | 5/1995 | Tsujimoto et al. ....... 219/121.15 |
| 2003/0024479 | A1 | * | 2/2003 | Kashiwaya et al. .......... 118/726 |
| 2003/0085115 | A1 | | 5/2003 | Tani et al. |
| 2005/0120959 | A1 | * | 6/2005 | Isoda et al. .................... 118/726 |
| 2005/0189228 | A1 | | 9/2005 | Huang |
| 2007/0248751 | A1 | | 10/2007 | Ling et al. |
| 2008/0199609 | A1 | | 8/2008 | Kuan et al. |

FOREIGN PATENT DOCUMENTS

JP          10-026698          1/1998

(Continued)

OTHER PUBLICATIONS

English translation JP 2005-113159, Ito, Apr. 2005.*
English Translation JP 2007-231303, So et al. Sep. 2007.*

(Continued)

*Primary Examiner* — Keath Chen
(74) *Attorney, Agent, or Firm* — Robert E. Bushnell, Esq.

(57) ABSTRACT

Provided is an evaporating apparatus that deposits a deposition material onto a treatment object. The evaporating apparatus includes a base, a deposition source, and first and second correction units. The deposition source deposits the deposition material onto the treatment object. The base is disposed separately from the treatment object. The deposition source is placed on a surface of the base. The first and second correction units located between the deposition source and the treatment object. The first and second correction units are disposed on outer regions of the deposition source and face each other. Each of the first and second correction units rotates to control the thickness of a layer formed by the deposition material deposited on the treatment object.

19 Claims, 3 Drawing Sheets

(56) References Cited

FOREIGN PATENT DOCUMENTS

| | | |
|---|---|---|
| JP | 10-030170 | 2/1998 |
| JP | 2001172762 | 6/2001 |
| JP | 2004-238663 | 8/2004 |
| JP | 2005113159 | 4/2005 |
| JP | 2006312765 A | 11/2006 |
| JP | 2007231303 | 9/2007 |
| JP | 2008248301 A | 10/2008 |
| KR | 20030036109 A | 5/2003 |

OTHER PUBLICATIONS

Korean Registration Determination Certificate issued by KIPO on Dec. 23, 2011, corresponding to KR 10-2009-0038450. and "Request for Entry of the prior art references" attached herewith.

Japanese Office Action issued by JPO on Jun. 5, 2012 in connection with Japanese Patent Application No. 2010-062241, which also claims Korean Patent Application No. 10-2009-0038450 and Request for Entry of the Accompanying Office Action attached herewith.

* cited by examiner (a)

(b)

EVAPORATING APPARATUS

CLAIM OF PRIORITY

This application makes reference to, incorporates the same herein, and claims all benefits accruing under 35 U.S.C. §119 from an application earlier filed in the Korean Intellectual Property Office on 30 Apr. 2009 and there duly assigned Serial No. 10-2009-0038450.

BACKGROUND OF THE INVENTION

1. Field of the Invention

An aspect of the present invention relates to an evaporating apparatus, and more particularly, to an evaporating apparatus that can increase thickness uniformity of a thin film deposited on a treatment object.

2. Description of the Related Art

In flat panel display devices such as an organic light emitting display device, an organic material or a metal used for an electrode is formed as a thin film on a flat panel by depositing a corresponding material onto the flat panel under a vacuum atmosphere.

Thickness uniformity of a thin film greatly affects the characteristics of a display device, such as color coordinate distribution. Therefore, attempts have been made to increase the thickness uniformity of a thin film during deposition.

As an example, an evaporating apparatus that can optimize thickness uniformity of a film by controlling scattering angle of a deposition material has been disclosed. In this evaporating apparatus, a deposition material shield is formed on a deposition source so as to easily deposit the deposition material onto a large area substrate. However, since the structure is fixed, the thickness of the film deposited is not uniform on sides of the substrate.

SUMMARY OF THE INVENTION

To address the above and/or other problems, the present invention provides an evaporating apparatus that can control thickness of films deposited on a treatment object to be uniform.

According to an aspect of the present invention, there is provided an evaporating apparatus that deposits a deposition material onto a treatment object. The evaporating apparatus includes a base disposed separately from the treatment object, a deposition source that deposits the deposition material onto the treatment object, a first correction unit located between the deposition source and the treatment object, and a second correction unit located between the deposition source and the treatment object. The deposition source is placed on a surface of the base. The first correction unit is disposed on a first outer region of the deposition source, and the second correction unit disposed on a second outer region of the deposition source. The second correction unit faces the first correction unit. Each of the first and second correction units rotates to control the thickness of a layer formed by the deposition material deposited on the treatment object.

The deposition source may include at least one linear deposition source.

The first correction unit may be disposed to cover a portion of a first outer region of the linear deposition source and disposed along a length direction of the linear deposition source. The first correction unit may rotate in a state parallel to the linear deposition source. The first correction unit may be panned with respect to the linear deposition source.

The second correction unit may be disposed to cover a portion of a second outer region of the linear deposition source and disposed along a length direction of the linear deposition source. The second correction unit may rotate in a state parallel to the linear deposition source. The second correction unit may be panned with respect to the linear deposition source.

The first and second correction units may be panned in a state parallel to the treatment object to uniformly control the thickness of the layer formed by the deposition material deposited on the first and second outer regions of the treatment object, respectively.

The evaporating apparatus may further include a film thickness measuring unit to measure the thickness of the layer formed by the deposition material deposited on the treatment object.

The first and second correction units may be disposed along the length direction of the linear deposition source.

The first correction unit may include a first correction plate that is disposed between the linear deposition source and the treatment object, a first rotation bar, and a first driving unit. The first side along a length direction of the first correction plate covers a first outer portion along a length direction of the linear deposition source. A first end of the first rotation bar is coupled to the first correction plate and a second end of the first rotation bar is coupled to the base. The first rotation bar rotates the first correction plate. The first driving unit rotates the first rotation bar with respect to a rotation axis of the first rotation bar.

A first surface of the first correction plate may face the treatment object.

The first correction plate may be disposed along the length direction of the linear deposition source. The first correction plate may be panned in a clockwise direction and a counter-clockwise direction according to the rotation of the first rotation bar rotating in the clockwise direction and the counter-clockwise direction, respectively, with respect to a rotation axis of the first rotation bar. The first correction plate may be panned in the clockwise direction or the counter-clockwise direction maintaining a surface of the first correction plate parallel to the treatment object.

The second correction unit may include a second correction plate that is disposed between the linear deposition source and the treatment object, a second rotation bar, and a second driving unit. A first side along a length direction of the second correction plate covers a first outer portion along a length direction of the linear deposition source. A first end of the second rotation bar is coupled to the second correction plate and a second end of the second rotation bar is coupled to the base. The second rotation bar rotates the second correction plate. The second driving unit that rotates the second rotation bar with respect to a rotation axis of the second rotation bar.

A first surface of the second correction plate may face the treatment object.

The second correction plate may be disposed along the length direction of the linear deposition source. The second correction plate may be panned in a clockwise direction and a counter-clockwise direction according to the rotation of the second rotation bar rotating in the clockwise direction and the counter-clockwise direction, respectively, with respect to a rotation axis of the second rotation bar. The second correction plate may be panned in the clockwise direction or the counter-clockwise direction maintaining a surface of the second correction plate parallel to the treatment object.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
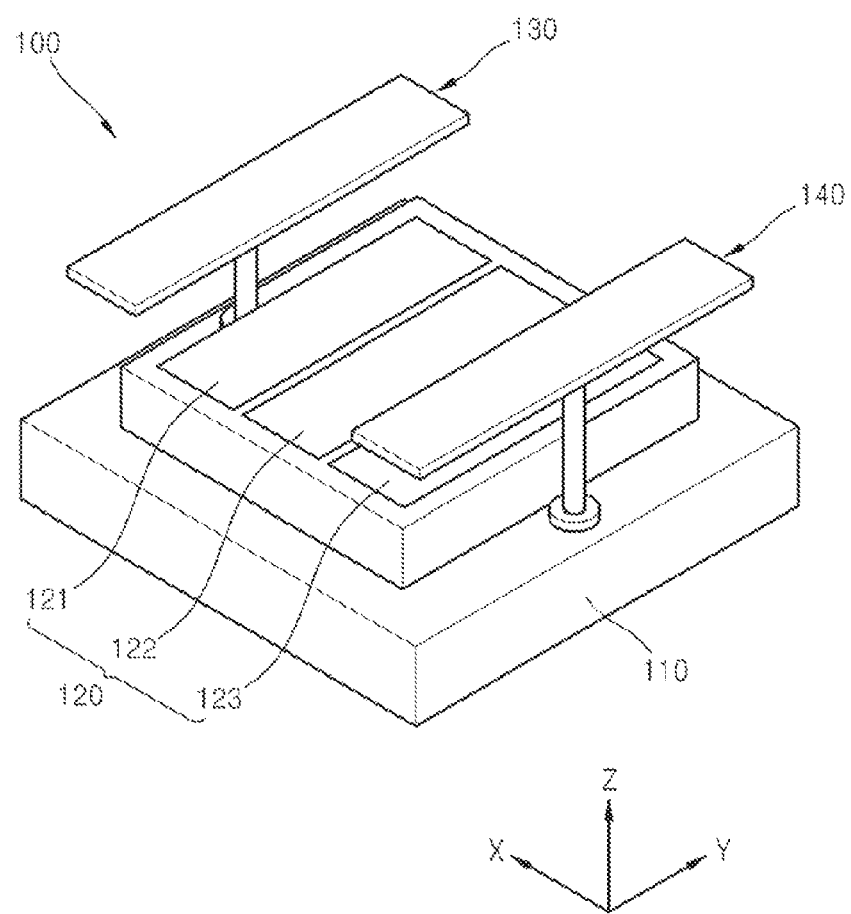
FIG. 1 is a schematic perspective view of an evaporating apparatus according to an embodiment of the present invention.

The present invention will now be described more fully with reference to the accompanying drawings in which exemplary embodiments of the invention are shown. In the drawings, the thicknesses of layers and regions are exaggerated for clarity, and like reference numerals refer to the like elements.

Figure 2:
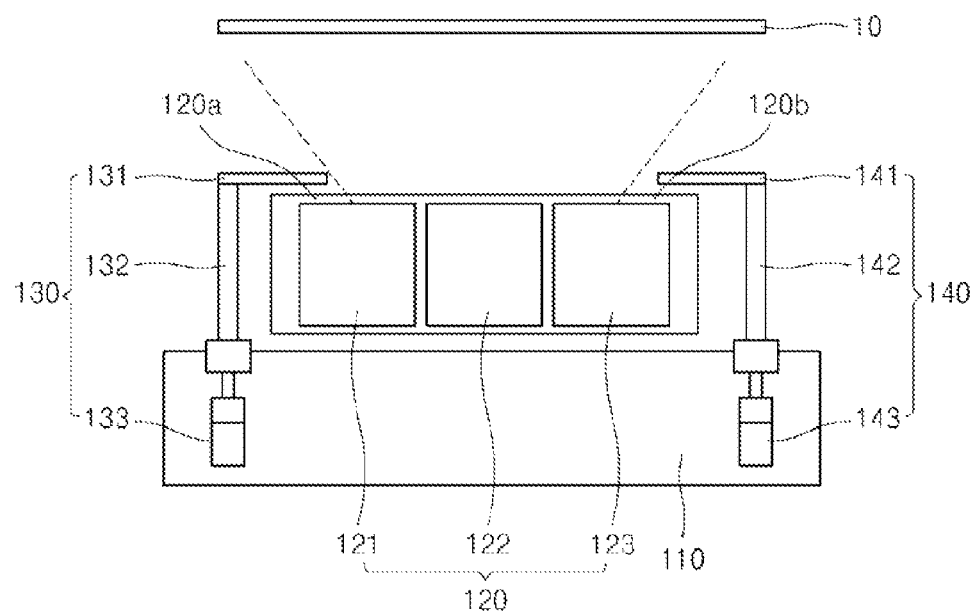
FIG. 2 is a cross-sectional view of the evaporating apparatus of FIG. 1.
Figure 3:
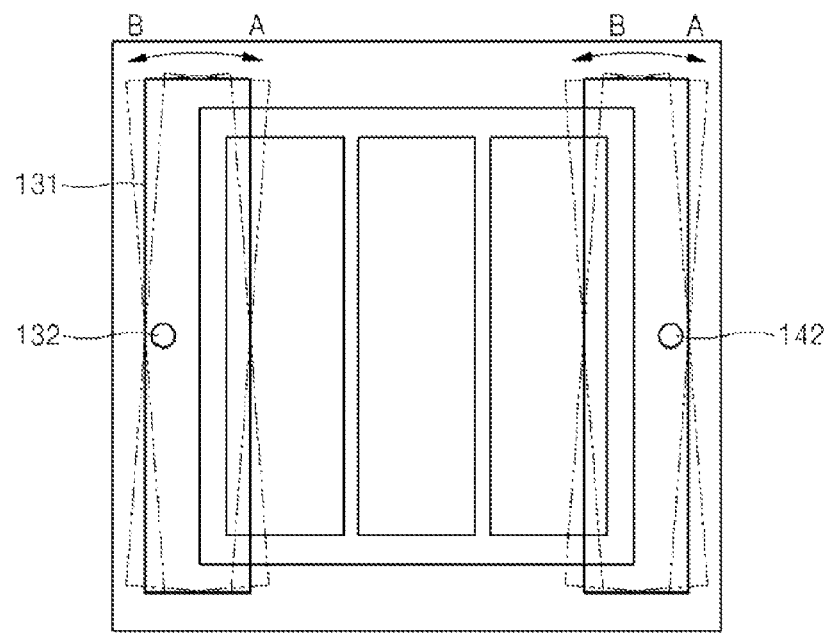
FIG. 3 is a plan view of the evaporating apparatus of FIG. 1.

FIG. 1 is a schematic perspective view of an evaporating apparatus 100 according to an embodiment of the present invention. FIG. 2 is a cross-sectional view of the evaporating apparatus 100 of FIG. 1. FIG. 3 is a plan view of the evaporating apparatus 100 of FIG. 1.

For convenience of explanation, although a chamber is not shown in FIG. 1, the configuration of FIG. 1 may be disposed in a chamber that maintains an appropriate state of vacuum. Also, the chamber may maintain an inert gas atmosphere via an inert gas.

A substrate 10 (shown in FIG. 2) is a treatment object and is placed in the chamber. More specifically, the substrate 10 is disposed on a deposition source 120 so that a surface of the substrate 10 can face the deposition source 120. The substrate 10 may be a flat panel display panel, or may be a large area substrate such as a mother glass on which a plurality of flat panel display panels is formed.

Referring to FIG. 2, the deposition source 120 is disposed facing the substrate 10 and is separated from a lower surface of the substrate 10. The deposition source 120 may include at least one of linear deposition sources 121, 122, and 123 disposed parallel to each other. A length direction of the linear deposition sources 121, 122, and 123 may be disposed along a Y axis direction and the linear deposition sources 121, 122, and 123 may be disposed on a base 110. Herein, a length direction of an element is defined as a direction parallel to the longest side of the element. In the arrangement shown in FIG. 1, the longest side of the linear deposition source 121 is parallel to Y axis, and therefore, the length direction of the linear deposition source 121 is Y axis direction in this case. But if the linear deposition source 121 rotates, the length direction of the linear deposition source may not be parallel to Y axis. The deposition source 120 deposits a deposition material onto a surface of the substrate 10, which is a treatment object.

In the current embodiment, the deposition source 120 includes the linear deposition sub-sources 121, 122, and 123; however, the present invention is not limited thereto. That is, the deposition source 120 may include a plurality of deposition crucibles arranged in a row. That is, referring to FIG. 1, the deposition source 120 may include a plurality of deposition crucibles arranged along the Y axis.

First and second correction units 130 and 140 are disposed between the deposition source 120 and the substrate 10. More specifically, the first and second correction units 130 and 140 are disposed covering portions of first and second outer regions 120a and 120b, respectively. The first and second correction units 130 and 140 face each other. Referring to FIG. 1, the first correction unit 130 is disposed to cover an outer portion of the first outer region 120a, and the second correction unit 140 is disposed to cover an outer portion of the second outer region 120b. A length direction of the first and second correction units 130 and 140 may be disposed parallel to the length direction of the deposition source 120, that is, the Y axis direction as shown in FIG. 1.

The first and second correction units 130 and 140 may be panned with respect to the deposition source 120. That is, the length direction of the first and second correction units 130 and 140 is parallel to or intersects the length direction of the deposition source 120 by moving in a clockwise direction A or a counter-clockwise direction B. The first and second correction units 130 and 140 may be panned while maintaining surfaces thereof parallel to the deposition source 120. The thickness of a layer formed by a deposition material that is evaporated from the deposition source 120 and is deposited on the substrate 10 may be controlled by panning the first and second correction units 130 and 140. In particular, in the case of a linear deposition source (according to a comparative example), the thickness of a layer formed by a deposition material on a left outer region of the substrate 10 is different from that of a right outer region of the substrate 10. However, as described above, in the case of the deposition source 120 according to an embodiment of the present invention, the thickness of a layer formed by a deposition material on the left outer region of the substrate 10 and that on the right outer region of the substrate 10 can be controlled by panning the first and second correction units 130 and 140 at the first and second outer regions 120a and 120b of the deposition source 120.

Referring to FIG. 2, the first correction unit 130 may include a first correction plate 131, a first rotation bar 132, and a first driving unit 133, and the second correction unit 140 may include a second correction plate 141, a second rotation bar 142, and a second driving unit 143.

The first and second correction plates 131 and 141 are located between the deposition source 120 and the substrate 10. A first surface of each of the first and second correction plates 131 and 141 faces the deposition source 120, and a second surface of each of the first and second correction plates 131 and 141 faces the substrate 10. The first and second correction plates 131 and 141 are disposed covering portions of the first and second outer regions 120a and 120b of the deposition source 120, respectively. The first correction plate 131 faces the first outer region 120a, and the second correction plate 141 faces the second outer region 120b. As shown in FIG. 2, the first correction plate 131 may be disposed to cover a portion of an outer region of the first outer region 120a, and the second correction plate 141 may be disposed to cover a portion of an outer region of the second outer region 120b. The length direction of the first and second correction plates 131 and 141 may be parallel to the length direction of the deposition source 120, that is, the Y axis in FIG. 1.

The first and second correction plates 131 and 141 are supported by the first and second rotation bars 132 and 142, respectively. That is, a first end of the first rotation bar 132 is coupled to the first correction plate 131, and a second end of the first rotation bar 132 is coupled to the base 110. A first end of the second rotation bar 142 is coupled to the second correction plate 141, and a second end of the second rotation bar 142 is coupled to the base 110. The first and second rotation bars 132 and 142 may be rotated about their respective rotation axis. The rotation axes of the first and second rotation bars 132 and 142 may be axes that are substantially perpendicular to the surface of the substrate 10 facing the deposition source 120. The first and second rotation bars 132 and 142 can be rotated in the clockwise direction A or in the counterclockwise direction B about their respective rotation axis, and thus, the first and second correction plates 131 and 141 can be panned. For example, the first correction plate 131 or the second correction plate 141 can be panned maintaining a surface of the first correction plate 131 or the second correction plate 141 parallel to the surface of the substrate 10 facing the deposition source 120. As described above, as the first and second correction plates 131 and 141 are panned, the thickness uniformity of a layer formed by a deposition material deposited on the left region and that of the right region of the substrate 10 can be controlled.

Figure 4A:
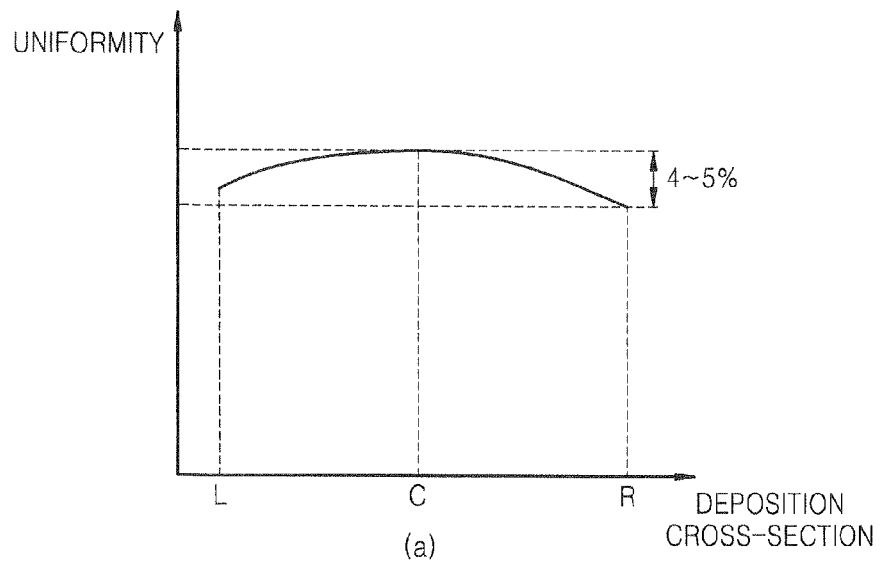
FIGS. 4A and 4B are graphs showing thickness uniformity of a deposition material deposited on a treatment object.
Figure 4B:
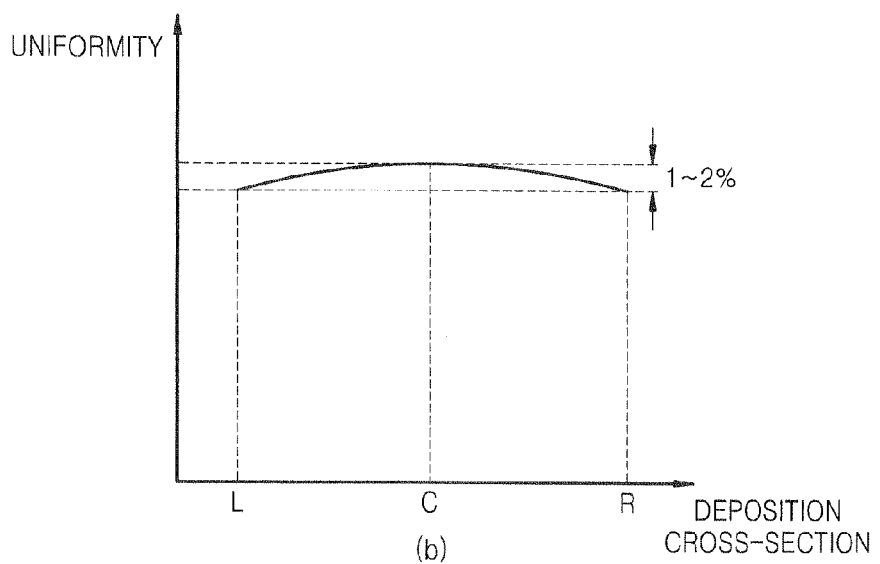

FIGS. 4A and 4B are graphs showing thickness uniformity of layers formed by a deposition material according to deposition cross-sections. More specifically, FIG. 4A shows the uniformity of a layer formed by a deposition material deposited using a conventional evaporating apparatus, and FIG. 4B shows the uniformity of a layer formed by a deposition material deposited using an evaporating apparatus according to an embodiment of the present invention.

The conventional evaporating apparatus includes correction plates fixed on outer regions of a linear deposition source. In the case of the fixed correction plate, the thickness control of the layer formed by the deposition material on left and right regions cannot be performed. Thus, as shown in FIG. 4A, it is observed that the thickness of the layer formed by the deposition material on a left outer region L is different from that of a right outer region R. In particular, the difference between the thickness of the layer formed by the deposition material of a center C of the substrate and that of the right outer region R shows a thickness difference of approximately 4 to 5% with respect to the thickness of the layer formed by the deposition material of the center C. The difference between the thickness of the layer formed by the deposition material of the center C of the substrate and that of the left outer region L is less than 4 to 5% with respect to the thickness of the layer formed by the deposition material of the center C.

Referring to FIG. 4B, the thickness of the layer formed by the deposition material deposited on the left outer region and that of the right outer region of the substrate are substantially the same, and in particular, the differences between the thickness of the layer formed by the deposition material of the center C of the substrate and that of either the right outer region R and the left outer region L are similar to each other, that is, a difference of approximately 1 to 2% with respect to the thickness of the layer formed by the deposition material of the center C.

The first and second driving units 133 and 143 may be disposed within the base 110, and may be connected to the first and second rotation bars 132 and 142, respectively, to provide driving force to rotate the first and second rotation bars 132 and 142 about their respective rotation axis. The first and second driving units 133 and 143 may be servo motors.

The evaporating apparatus 100 according to an embodiment of the present invention may further include a film thickness measuring unit. The film thickness measuring unit measures the thickness of a deposition material deposited on the substrate 10, and may control the first and second driving units 133 and 143 to rotate the first and second correction plates 131 and 141 when there is a difference in thickness of the deposition material of the left outer region L and that of the right outer region R of the substrate.

While the present invention has been particularly shown and described with reference to exemplary embodiments thereof, it will be understood by one of ordinary skill in the art that various changes in form and details may be made therein without departing from the spirit and scope of the present invention as defined by the following claims.

What is claimed is:

1. An evaporating apparatus that deposits a deposition material onto a treatment object, the evaporating apparatus comprising:
    a base disposed separately from the treatment object;
    a deposition source that evaporates the deposition material onto the treatment object, the deposition source placed on a surface of the base, the deposition source including a first outer region and a second outer region, the deposition material evaporating from the first and second outer regions;
    a first correction unit including a first correction plate located between the deposition source and the treatment object, the first correction plate covering the first outer region of the deposition source, the first correction plate having a first surface facing the deposition source, the first correction plate being capable of rotating about a rotation axis perpendicular to the first surface of the first correction plate, the rotation axis of the first correction plate positioned at a center of the first surface of the first correction plate so that there always exists a portion of the first outer region of the deposition source that is covered by the first correction plate while the deposition material is being evaporated from the deposition source; and
    a second correction unit including a second correction plate located between the deposition source and the treatment object, the second correction plate covering the second outer region of the deposition source, the second correction unit having a first surface facing the deposition source, the second correction plate being capable of rotating to control the thickness of a layer formed by the deposition material deposited on the treatment object.

2. The evaporating apparatus of claim 1, wherein the deposition source comprises at least one linear deposition source having one dimension longer than other dimensions.

3. The evaporating apparatus of claim 2, wherein the first correction plate is capable of being rotated to have a length direction of the first correction plate being parallel to a length direction of the linear deposition source, the first outer region of the deposition source formed in the linear deposition source along the length direction of the linear deposition source.

4. The evaporating apparatus of claim 3, wherein the first surface of the first correction plate is parallel to a surface, of the linear deposition source from which the deposition material evaporates.

5. The evaporating apparatus of claim 3, wherein the first correction plate is capable of rotating about the rotation axis of the first correction plate while the deposition material is being evaporated from the linear deposition source.

6. The evaporating apparatus of claim 3, wherein the second correction plate is capable of being rotated to have a length direction of the second correction plate being parallel to the length direction of the linear deposition source, the second outer region of the deposition source formed in the linear deposition source along the length direction of the linear deposition source.

7. The evaporating apparatus of claim 6, wherein the second correction plate is capable of rotating parallel to a surface of the linear deposition source from which the deposition material evaporates.

8. The evaporating apparatus of claim 6, wherein the second correction plate is capable of rotating while the deposition material is being evaporated from the linear deposition source.

9. The evaporating apparatus of claim 2, wherein both of the first and second correction plates are capable of being rotated to have length directions of the first and second correction plates being disposed along a length direction the linear deposition source.

10. The evaporating apparatus of claim 2, wherein the first correction unit comprises:
a first rotation bar, a first end of the first rotation bar coupled to the first correction plate and a second end of the first rotation bar coupled to the base, the first rotation bar rotating the first correction plate about the rotation axis of the first correction plate; and
a first driving unit that rotates the first rotation bar, a first side along a length direction of the first correction plate covering the first outer region of the deposition source formed in the linear deposition source along a length direction of the linear deposition source.

11. The evaporating apparatus of claim 10, wherein the first correction plate is capable of being rotated to have the length direction of the first correction plate being disposed along the length direction of the linear deposition source.

12. The evaporating apparatus of claim 11, wherein the first correction plate rotates in a clockwise direction and a counter-clockwise direction according to a rotation of the first rotation bar rotating in the clockwise direction and the counter-clockwise direction, respectively, with respect to the rotation axis of the first correction plate.

13. The evaporating apparatus of claim 12, wherein the first correction plate rotates in the clockwise direction or the counter-clockwise direction maintaining the first surface of the first correction plate parallel to the treatment object.

14. The evaporating apparatus of claim 10, wherein the second correction unit comprises:
a second rotation bar, as first end of the second rotation bar coupled to the second correction plate and a second end of the second rotation bar coupled to the base, the second rotation bar rotating the second correction plate about a rotation axis of the second correction plate; and
a second driving unit that rotates the second rotation bar, a first side along a length direction of the second correction plate covering the second outer region of the deposition source formed in the linear deposition source along the length direction of the linear deposition source.

15. The evaporating apparatus of claim 14, wherein the second correction plate is capable of rotating about the rotation axis of the second correction plate that is perpendicular to the first surface of the second correction plate.

16. The evaporating apparatus of claim 15, wherein the second correction plate is capable of being rotated to have the length direction of the second correction plate being disposed along the length direction of the linear deposition source.

17. The evaporating apparatus of claim 16, wherein the second correction plate rotates in a clockwise direction and a counter-clockwise direction according to a rotation of the second rotation bar rotating in the clockwise direction and the counter-clockwise direction, respectively, with respect to the rotation axis of the second correction plate.

18. The evaporating apparatus of claim 17, where the second correction plate rotates in the clockwise direction or the counter-clockwise direction maintaining the first surface of the second correction plate parallel to the treatment object.

19. The evaporating apparatus of claim 1, wherein the first and second correction plates are capable of rotating in a state parallel to a surface of the treatment object, on which the deposition material is deposited, to uniformly control the thickness of the layer formed by the deposition material deposited on the treatment object.

* * * * *